US009590090B2

(12) United States Patent
Fu et al.

(10) Patent No.: US 9,590,090 B2
(45) Date of Patent: Mar. 7, 2017

(54) METHOD OF FORMING CHANNEL OF GATE STRUCTURE

(71) Applicant: Taiwan Semiconductor Manufacturing Company Limited, Hsinchu (TW)

(72) Inventors: Ching-Feng Fu, Taichung (TW); De-Fang Chen, Hsinchu (TW); Chun-Hung Lee, Hsinchu (TW); Huan-Just Lin, Hsinchu (TW); Hui-Cheng Chang, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 202 days.

(21) Appl. No.: 14/150,177

(22) Filed: Jan. 8, 2014

(65) Prior Publication Data

US 2015/0194497 A1 Jul. 9, 2015

(51) Int. Cl.

| | |
|---|---|
| ***H01L 29/78*** | (2006.01) |
| ***H01L 29/423*** | (2006.01) |
| ***H01L 29/66*** | (2006.01) |
| ***H01L 29/786*** | (2006.01) |

(52) U.S. Cl.

CPC ........ *H01L 29/78* (2013.01); *H01L 29/42392* (2013.01); *H01L 29/66795* (2013.01); *H01L 29/785* (2013.01); *H01L 29/78696* (2013.01)

(58) Field of Classification Search

CPC ....... H01L 29/423; H01L 29/66; H01L 29/78; H01L 29/4232; H01L 29/66477

USPC .......................................... 438/296; 257/401

See application file for complete search history.

(56) References Cited

U.S. PATENT DOCUMENTS

2008/0073667 A1* 3/2008 Lochtefeld ........ H01L 29/66795 257/190
2012/0205774 A1* 8/2012 Wang ................. H01L 29/0649 257/506
2013/0099282 A1* 4/2013 Chen ................ H01L 29/66795 257/190

FOREIGN PATENT DOCUMENTS

TW 200417021 7/1992

OTHER PUBLICATIONS

Taiwanese Office Action; Application No. 103125965; dated Oct. 23, 2015.

* cited by examiner

*Primary Examiner* — Asok K Sarkar
*Assistant Examiner* — Dmitriy Yemelyanov
(74) *Attorney, Agent, or Firm* — Jones Day

(57) ABSTRACT

A method of forming a channel of a gate structure is provided. A first epitaxial channel layer is formed within a first trench of the gate structure. A dry etching process is performed on the first epitaxial channel layer to form a second trench. A second epitaxial channel layer is formed within the second trench.

20 Claims, 13 Drawing Sheets

METHOD OF FORMING CHANNEL OF GATE STRUCTURE

FIELD

This disclosure relates to semiconductor technology, and more particularly, a method of forming a channel of a gate structure.

BACKGROUND

In a conventional channel forming process of a gate structure, dislocation may occur between epitaxial channel layers within a trench of the gate structure. An electron and hole leakage may occur due to the dislocation while the gate structure is operated.

DETAILED DESCRIPTION

FIGS. 1-6 illustrate various cross-sectional views of a gate structure 100 during formation of a channel of the gate structure 100. A first direction is applied in viewing FIG. 1, FIG. 3, and FIG. 5. And a second direction is applied in viewing FIG. 2, FIG. 4, and FIG. 6. The first direction is orthogonal to the second direction.

Figure 1:
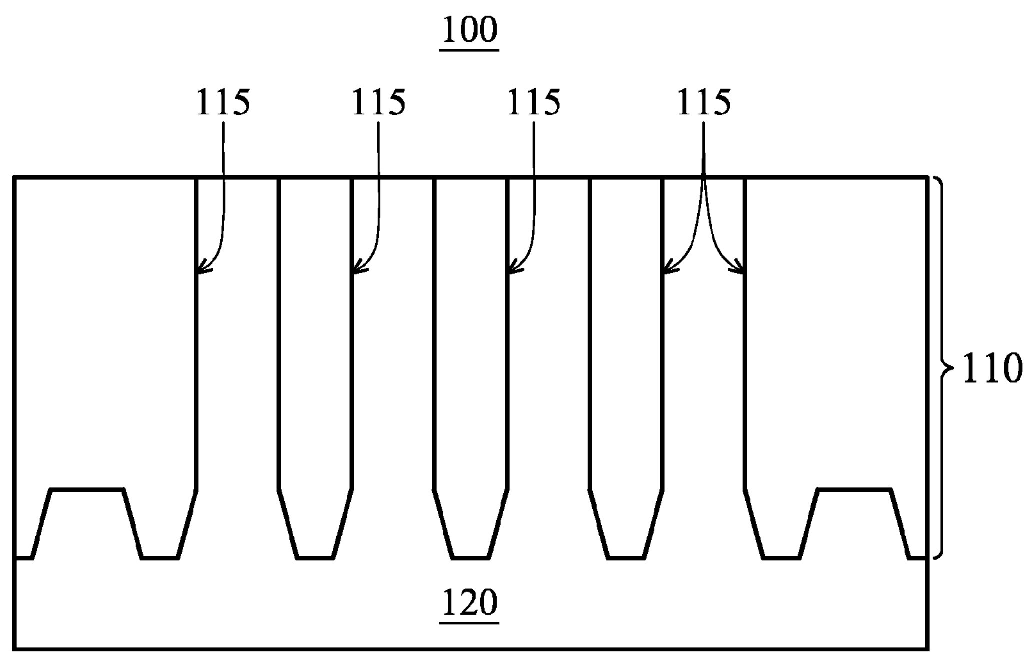
FIGS. 1-6 illustrate various cross-sectional views of a gate structure during formation of a channel of the gate structure.
Figure 2:
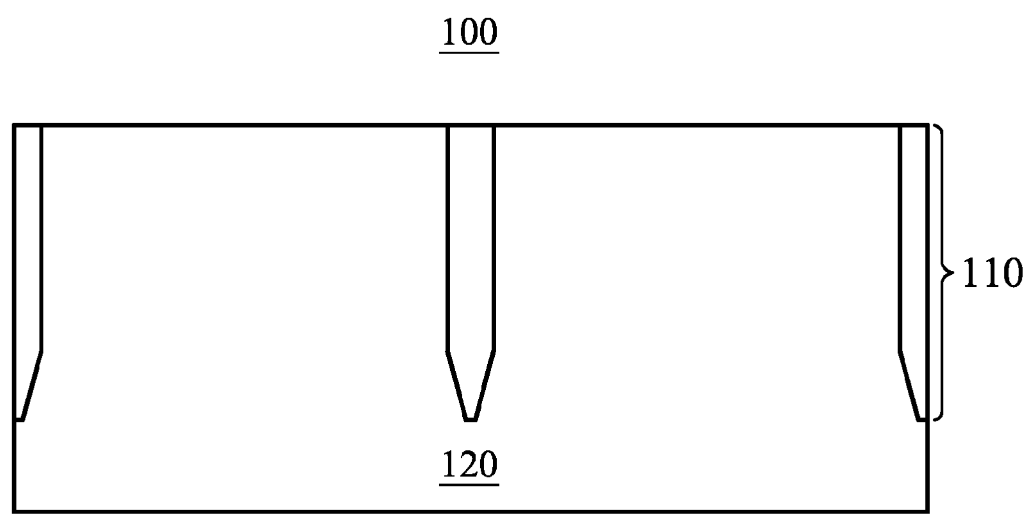

In FIG. 1 and FIG. 2, after a post-fin formation process and an STI process, the gate structure 100 includes an STI layer 110 and a silicon (Si) layer 120. There are a plurality of trenches 115 formed within the Si layer 120. The STI layer 110 is formed within the plurality of trenches 115 of the Si 120 in an interposed manner.

Figure 3:
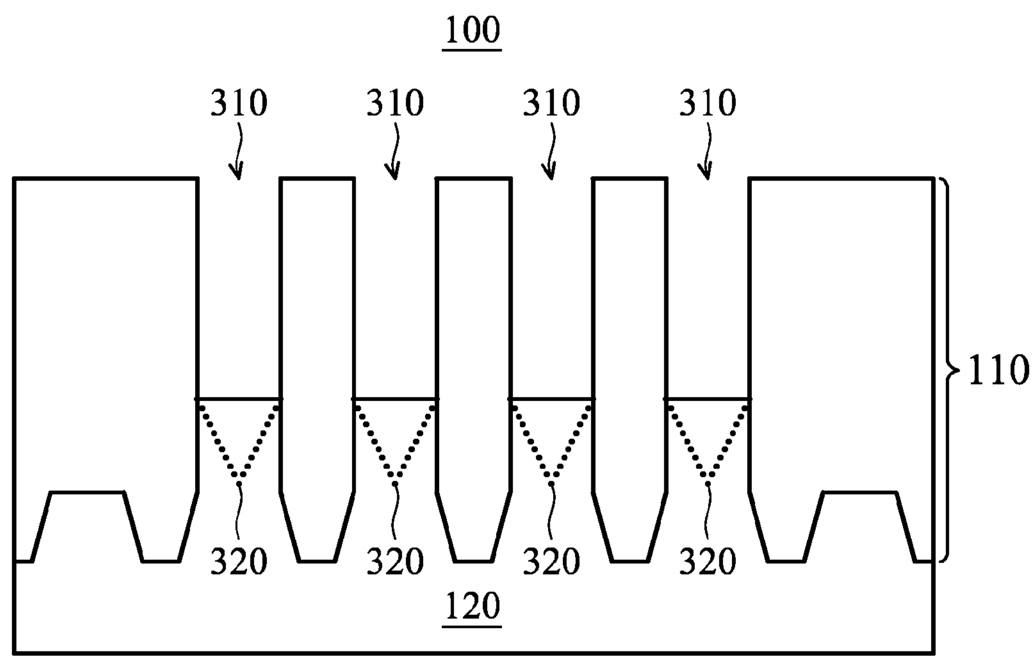
Figure 4:
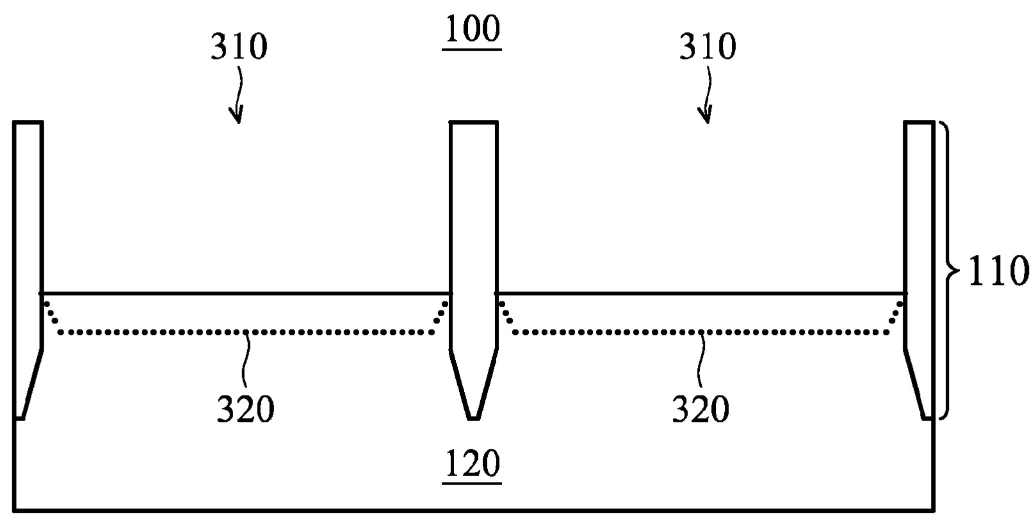

In FIG. 3 and FIG. 4, a recess process is performed after the post-fin formation process and the STI process. The recess process is performed for removing at least a portion of the Si 120 between the trenches 115. After removing at least a portion of the Si layer 120, first trenches 310 of the STI layer 110 are formed. Bottoms of the first trenches 310 may be flat bottoms, or may be concave bottoms as indicated by dotted lines 320.

Figure 5:
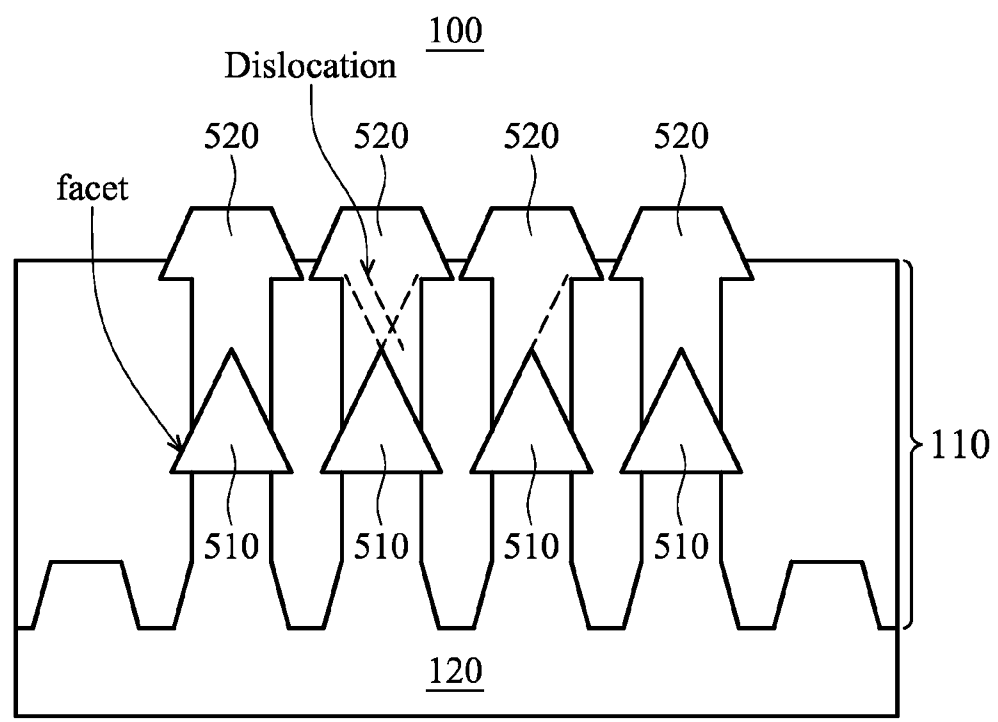
Figure 6:
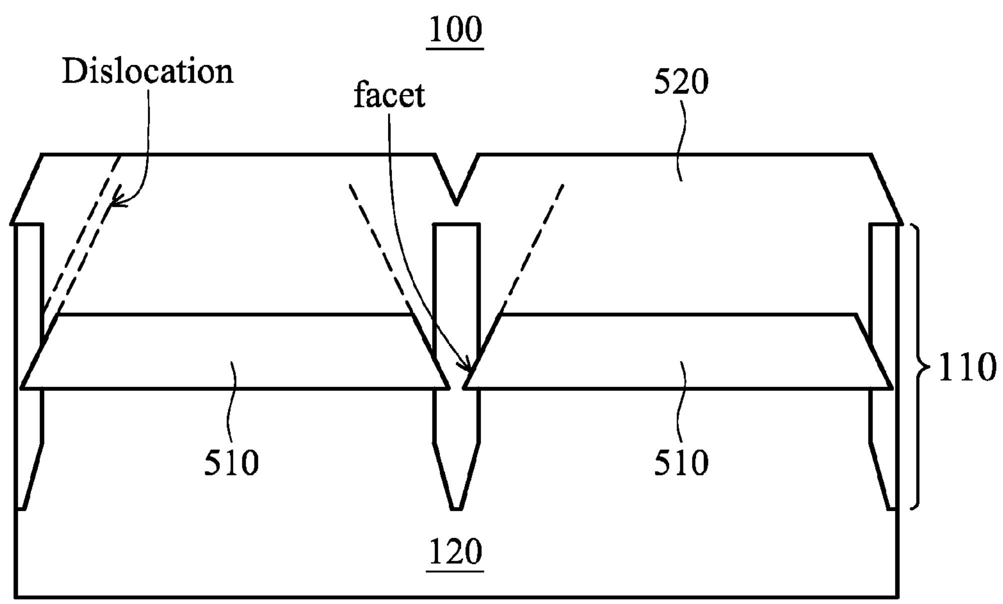

In FIG. 5 and FIG. 6, a first epitaxial channel layer 510 and a second epitaxial channel layer 520 are deposited within the first trenches 310. Generally, the first epitaxial channel layer 510 includes essentially germanium or silicon-germanium, and the second epitaxial channel layer 520 includes essentially silicon.

Due to an aspect ratio of the first trench 310, tapered corners may occur at edges of the first epitaxial channel layer 510 creating facets. Dislocation may occur to lattice mismatch between the first epitaxial channel layer 510 and the second epitaxial channel layer 520, i.e., due to lattice mismatch between germanium and silicon or between silicon-germanium and silicon. The dislocations spread tangential to the facets in the second epitaxial channel layer 520, resulting in electron and hole leakage.

When the first epitaxial channel layer 510 includes essentially germanium or silicon-germanium and the second epitaxial channel layer 520 includes essentially silicon and a fin height of the gate structure 100 is between about 30 nanometers and about 40 nanometers, a depth of the first trench 310 in FIG. 3 and FIG. 4 may be between about 60 nanometers and about 80 nanometers.

Figure 7:
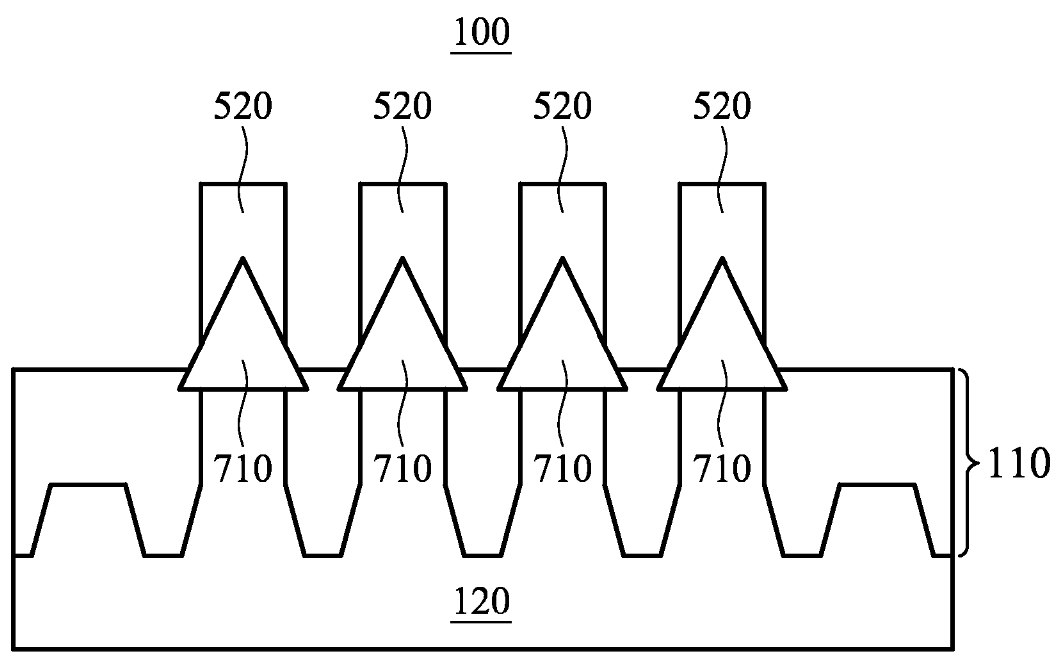
FIG. 7 and FIG. 8 illustrate various cross-sectional views while performing an Omega gate process of the gate structure.
Figure 8:
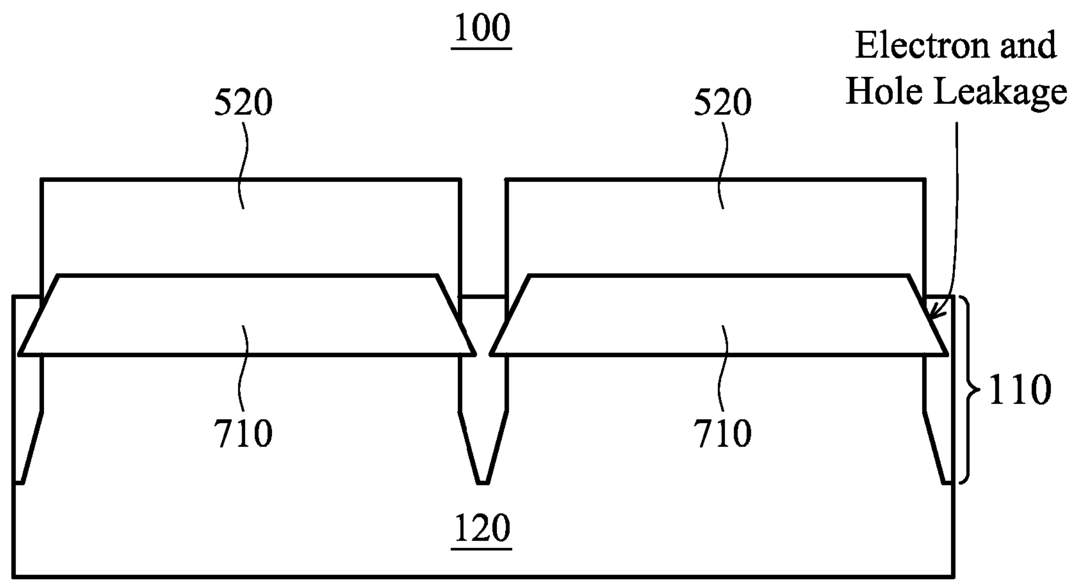
Figure 9:
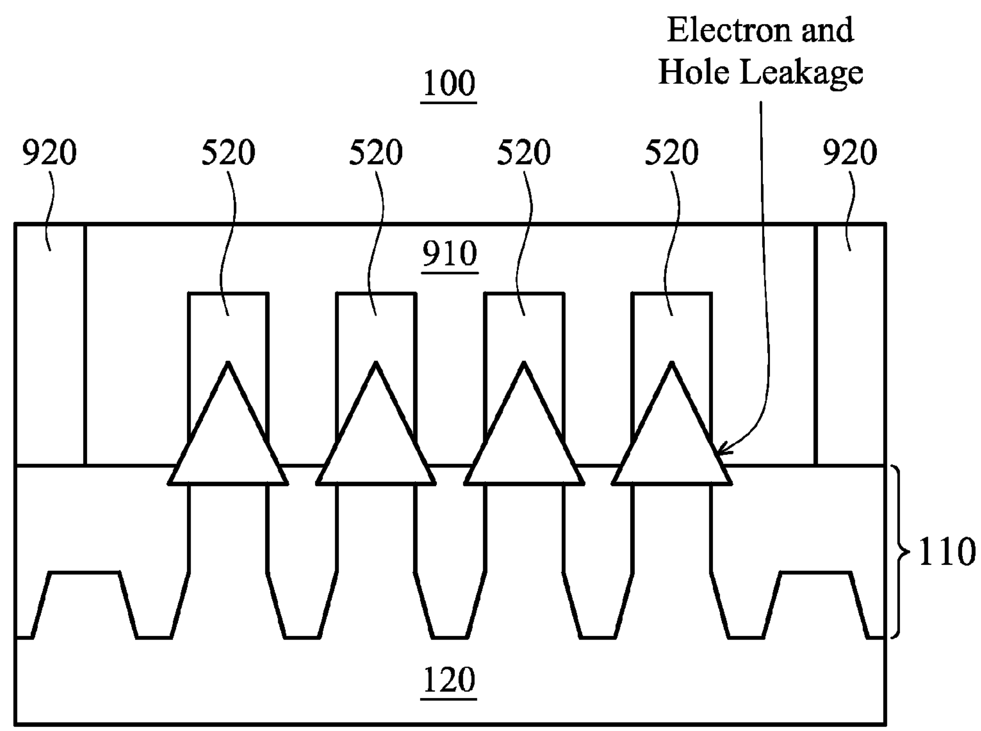
FIG. 9 and FIG. 10 illustrate various cross-sectional views while performing the GAA process of the gate structure.
Figure 10:
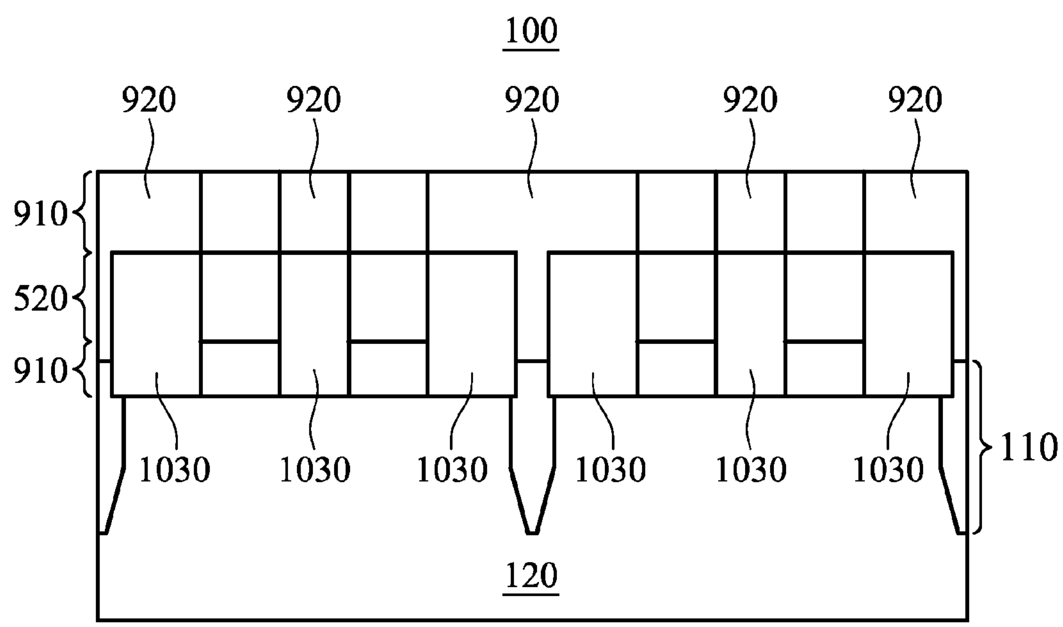

After the process of FIG. 5 and FIG. 6, a channel of the gate structure 100 may be additionally formed via an Omega gate process or a gate-all-around (GAA) process. FIG. 7 and FIG. 8 illustrate various cross-sectional views while performing the Omega gate process of the gate structure 100. FIG. 9 and FIG. 10 illustrate various cross-sectional views during GAA process of the gate structure 100. The first direction is applied in viewing FIG. 7 and FIG. 9. The second direction is applied in viewing FIG. 8 and FIG. 10.

In FIG. 7 and FIG. 8, the first epitaxial channel layer 510 is substantially oxidized to form an oxidation layer 710, and the STI layer 110 is recessed. A channel is thus substantially formed within the second epitaxial channel layer 520.

Due to the above mentioned dislocation, electron and hole leakage may occur at an interface between the oxidation layer 710 and the second epitaxial channel layer 520. Therefore, operational accuracy of the channel formed within the second epitaxial channel layer 520 may be reduced.

In FIG. 9 and FIG. 10, the first epitaxial channel layer 510 is etched, and a gate metal layer 910 is formed to substantially surround the second epitaxial channel layer 520. A channel is formed within the second epitaxial channel layer 520.

In FIG. 9 and FIG. 10, a source/drain layer 1030 may be additionally formed on the Si layer 120, and an interlayer dielectric (ILD) layer 920 may be additionally formed to at least partially cover the source/drain layer 1030 and the STI layer 110.

FIGS. 11-18 illustrate various cross-sectional views of the gate structure 100 during forming a channel of a gate structure 1100 according to a first embodiment. The first direction is applied in viewing FIG. 11, FIG. 13, FIG. 15, and FIG. 17 for viewing the gate structure 1100. The second direction is applied in viewing FIG. 12, FIG. 14, FIG. 16, and FIG. 18.

Figure 11:
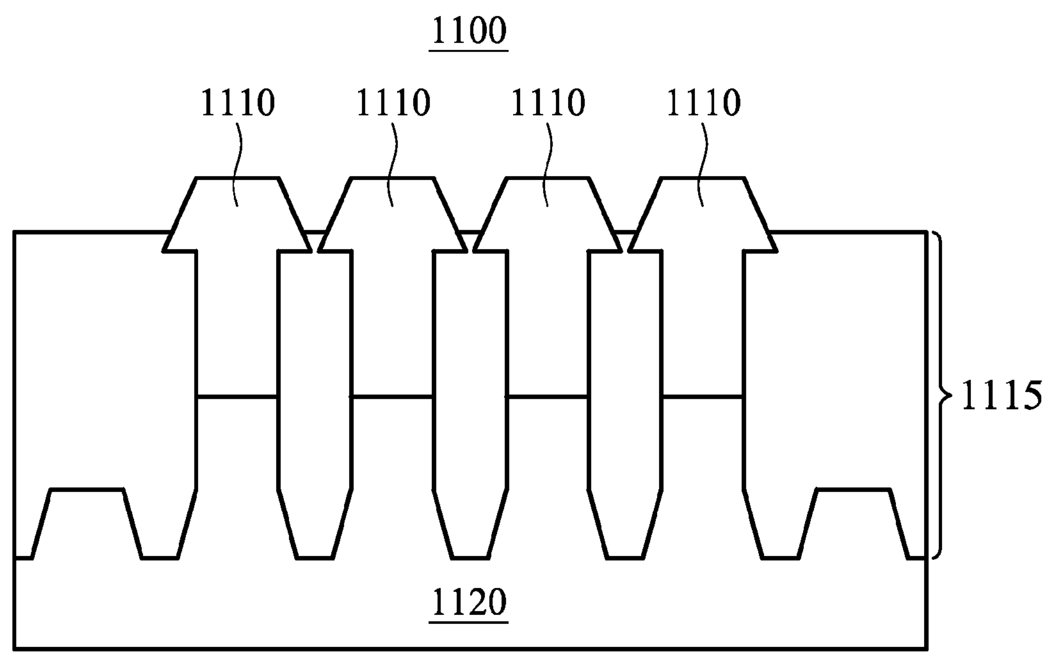
FIGS. 11-18 illustrate various cross-sectional views of the gate structure during forming a channel of the gate structure according to a first embodiment.
Figure 12:
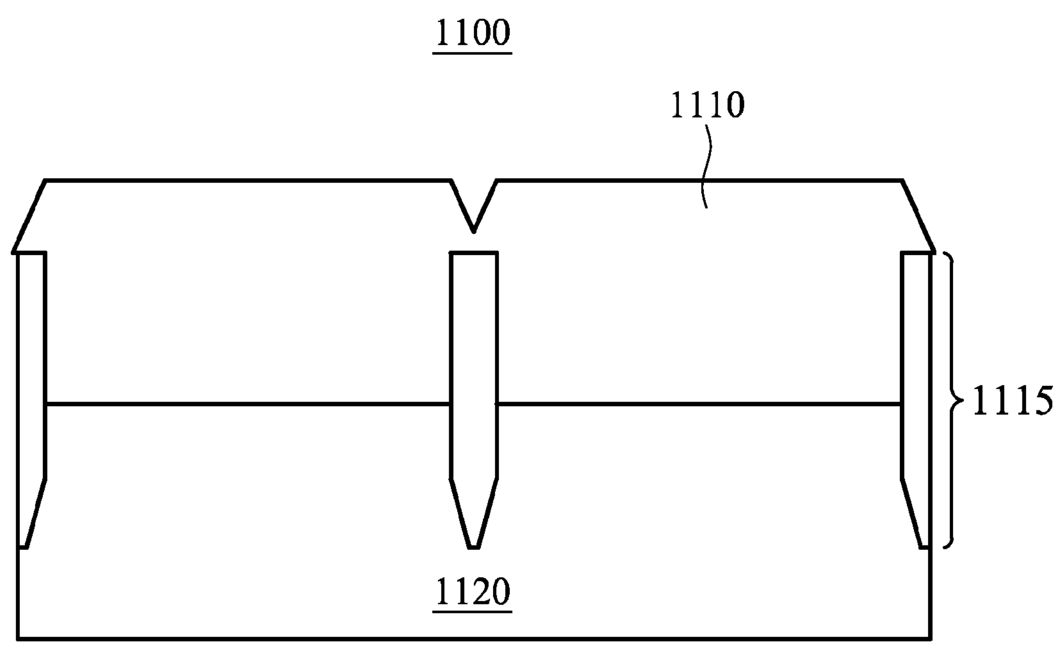

After forming the first trench as illustrated in FIG. 3 and FIG. 4, a first epitaxial channel layer 1110 may be deposited within the first trench or may be deposited to protrude out of the first trenches as shown in FIG. 11 and FIG. 12. The first epitaxial layer 1110 is formed between a STI layer 1115 and above a Si layer 1120.

Figure 13:
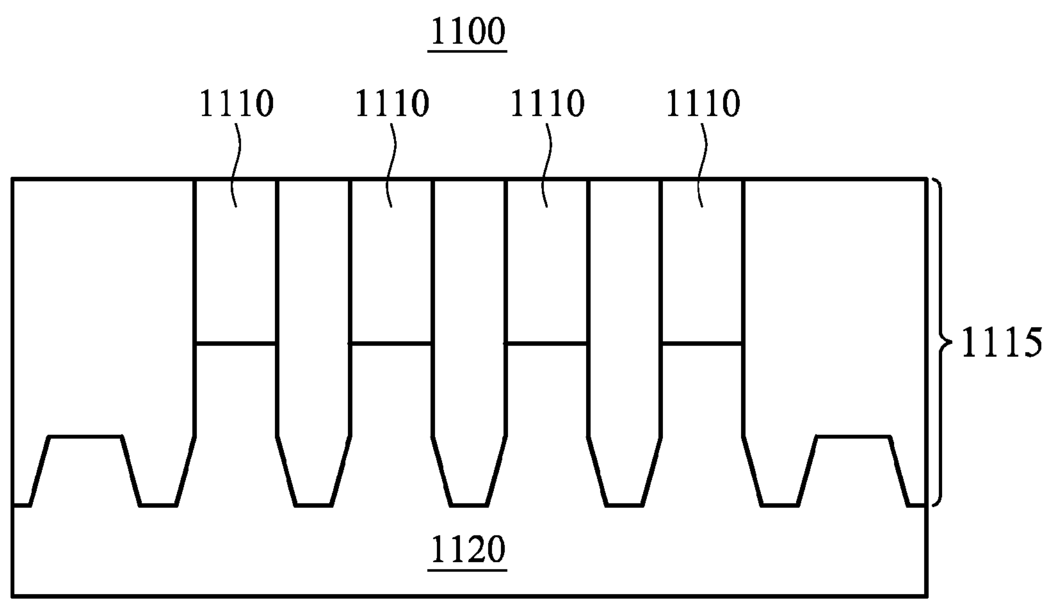
Figure 14:
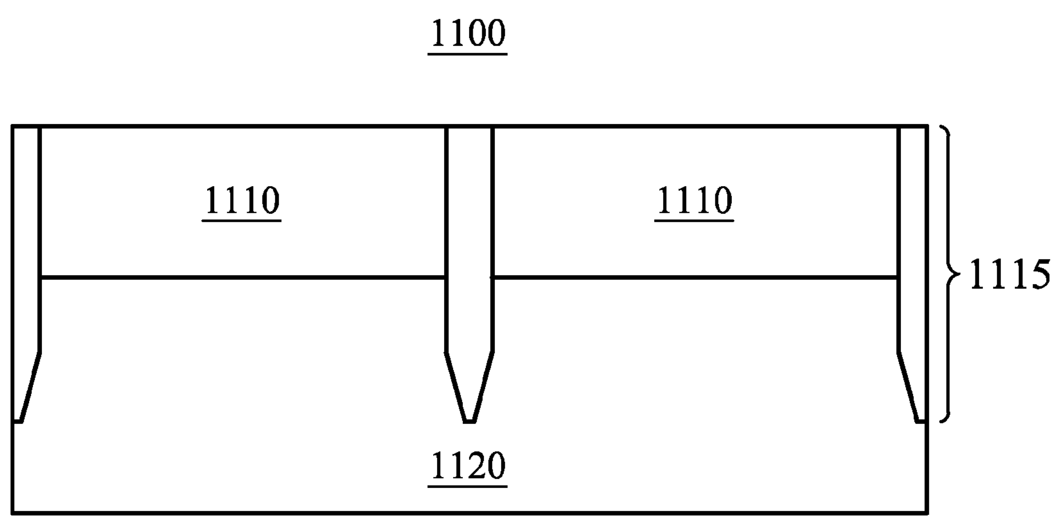

If the first epitaxial channel layer 1110 protrudes out of the first trench, FIG. 13 and FIG. 14 illustrate a chemical mechanical polishing (CMP) process that may be performed on the gate structure 1100 to planarize a top surface of the first epitaxial channel layer 1110 and a top surface of the STI layer 1115.

Figure 15:
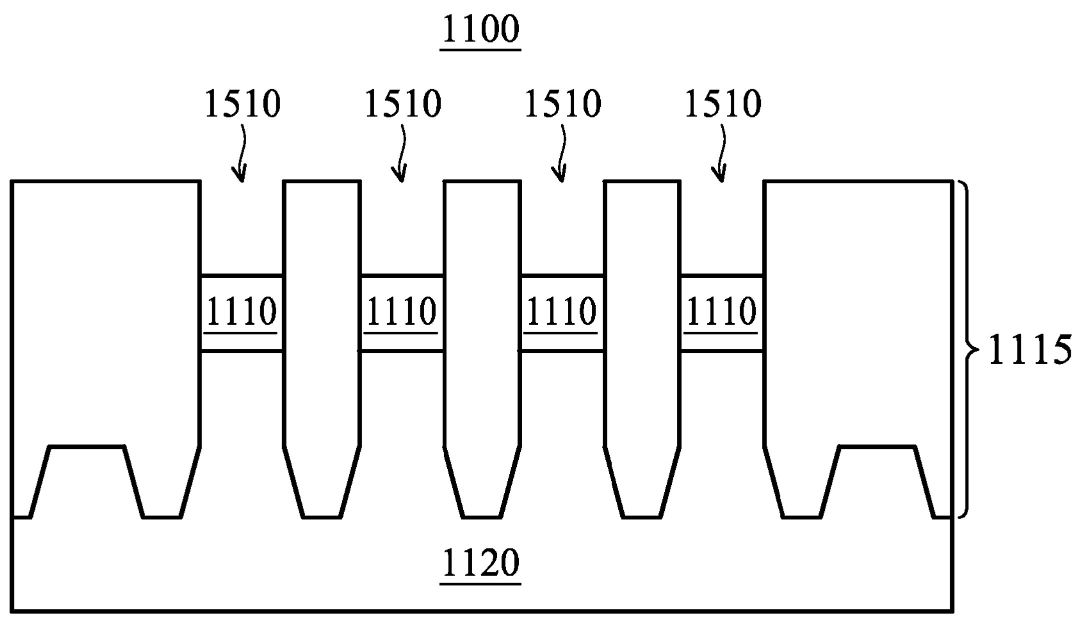
Figure 16:
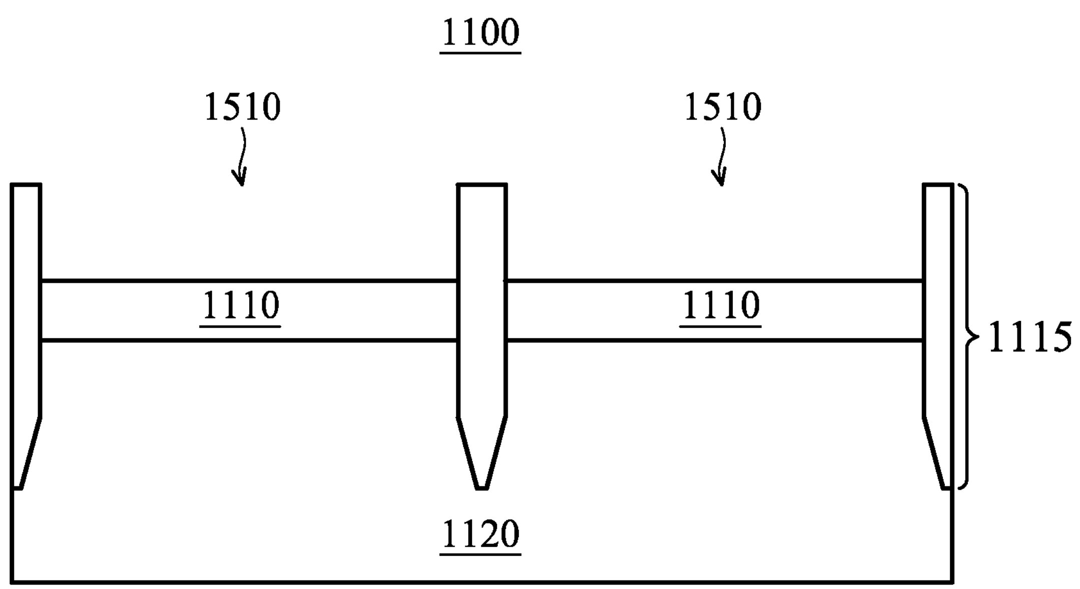

In FIG. 15 and FIG. 16, after depositing the first epitaxial channel layer 1110, the first epitaxial channel layer 1110 may be at least partially removed to form a plurality of second trenches 1510. The removal may be performed by dry etching to take advantage of its isotropic properties. That is, it focuses the removal on the first epitaxial channel layer 1110 with little etching on the STI layer 110.

In one embodiment, $Cl_2$ gas may be used for etching the first epitaxial channel layer 1110. $NF_3$ gas may be used for calibrating a range of performing the dry etching process on the first epitaxial channel layer 1110. He gas may be used for diluting densities of the $Cl_2$ gas and the $NF_3$ gas.

Moreover, a flux of the $Cl_2$ gas may be ranged from about 20 standard cubic centimeters per minute (sccm) to about 80 sccm. A flux of the $NF_3$ gas may be ranged from about 0 sccm to about 10 sccm. A flux of the He gas may be ranged from about 300 sccm to about 1000 sccm.

Figure 17:
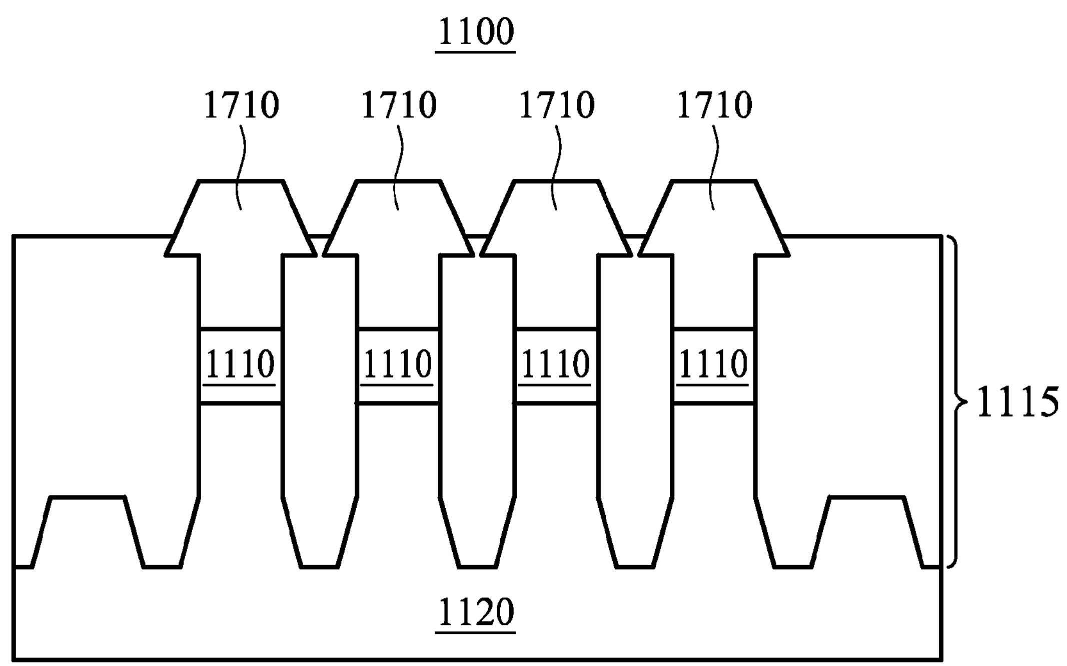
Figure 18:
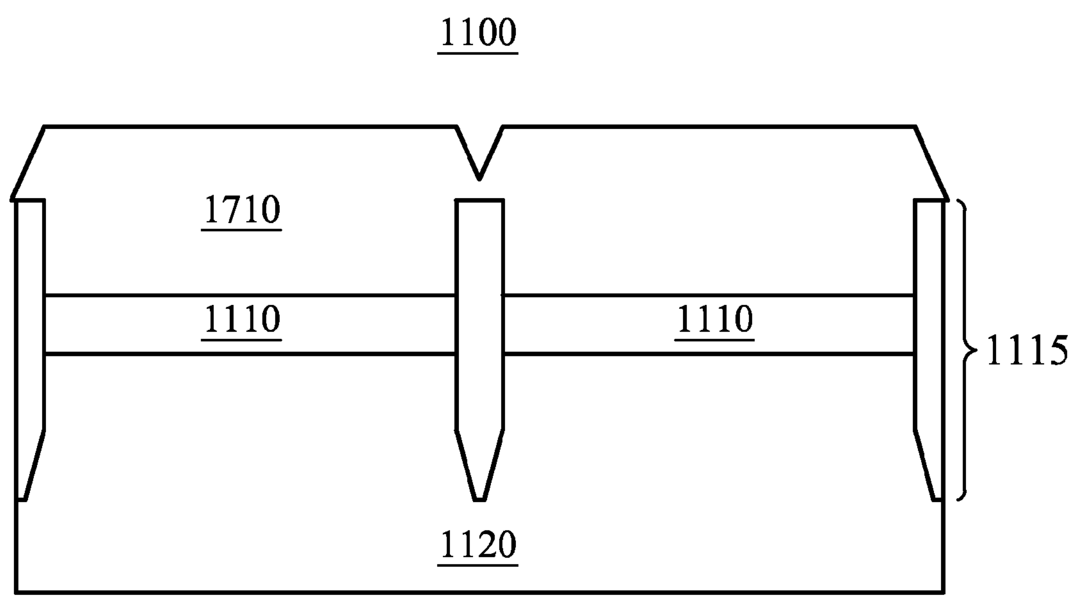

In FIG. 17 and FIG. 18, after recessing the first epitaxial channel layer 1110, a second epitaxial channel layer 1710 may be deposited within the second trench 1510, or may protrude out of the second trench 1510.

In the first embodiment, the first epitaxial channel layer 1110 may include germanium or silicon-germanium, and the second epitaxial channel layer 1710 may include germanium or silicon-germanium. With the aid of the materials utilized in the first epitaxial channel layer 1110 and the second epitaxial channel layer 1710, tapered edges that create angled facets are not formed. Therefore, dislocation between the first epitaxial channel layer 1110 and the second epitaxial channel layer 1710 may be alleviated.

A depth of the first trench 310 for loading the first epitaxial channel layer 1110 and the second epitaxial channel layer 1710 in FIG. 17 and FIG. 18 may be not as deep as a depth of the first trench 310 in FIG. 3 and FIG. 4. This causes the facets occurring at the edges of the first epitaxial channel layer 1110 to be reduced. In one embodiment, when the fin height of the gate structure 100 is between about 30 nanometers and about 40 nanometers, the depth of the first trench 310 may be between about 40 nanometers and about 50 nanometers.

In one embodiment, a density of germanium of the first epitaxial channel layer 1110 may be higher than a density of germanium of the second epitaxial channel layer 1710. Therefore, the dislocation between the first epitaxial channel layer 1110 and the second epitaxial channel layer 1710 may be better alleviated.

Figure 19:
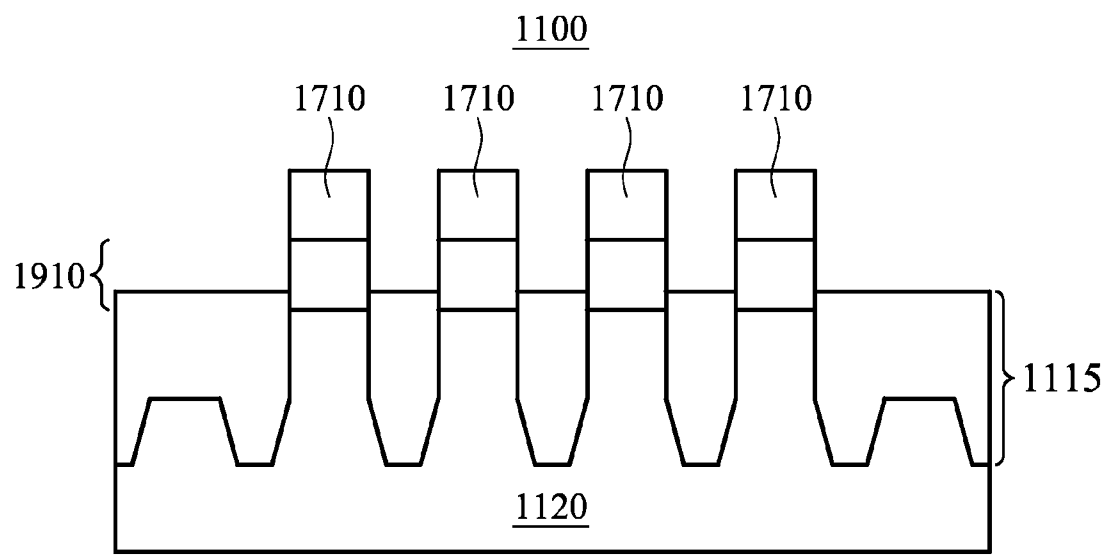
FIG. 19 and FIG. 20 illustrate various cross-sectional views of the gate structure during performing the Omega gate process on the gate structure 100 according to a second embodiment.
Figure 20:
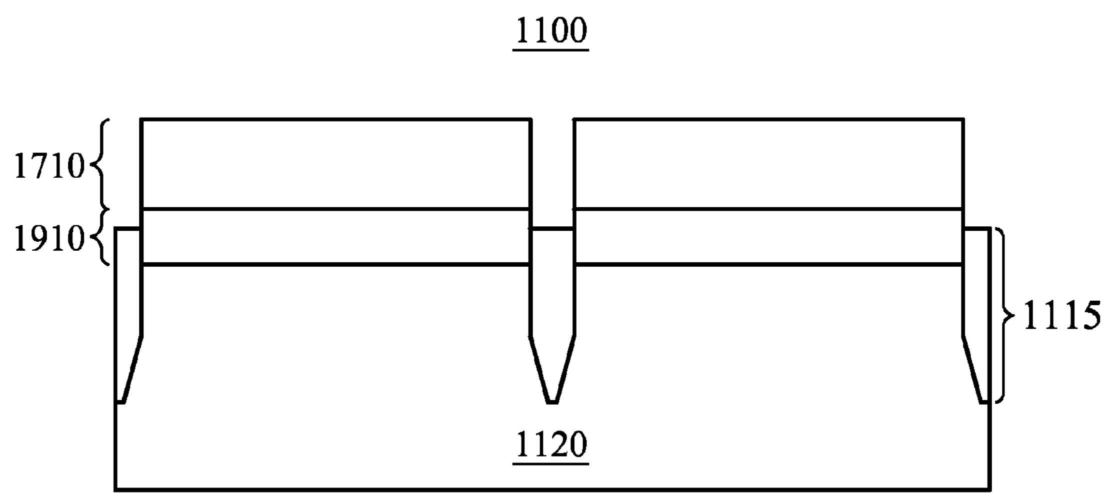
Figure 21:
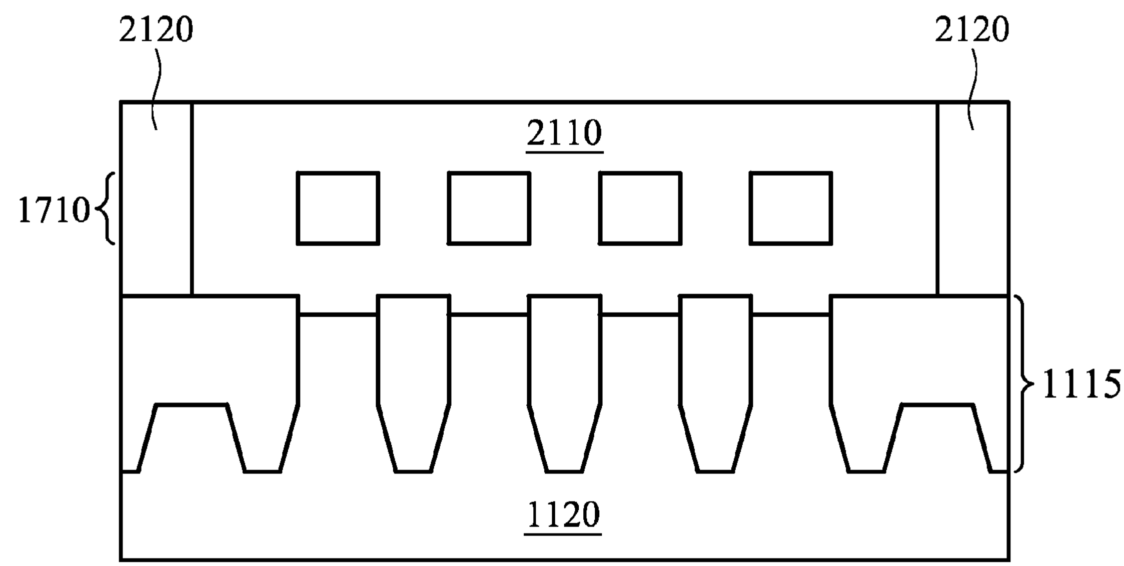
FIG. 21 and FIG. 22 illustrate various cross-sectional views of the gate structure during performing the GAA process on the gate structure according to a third embodiment.
Figure 22:
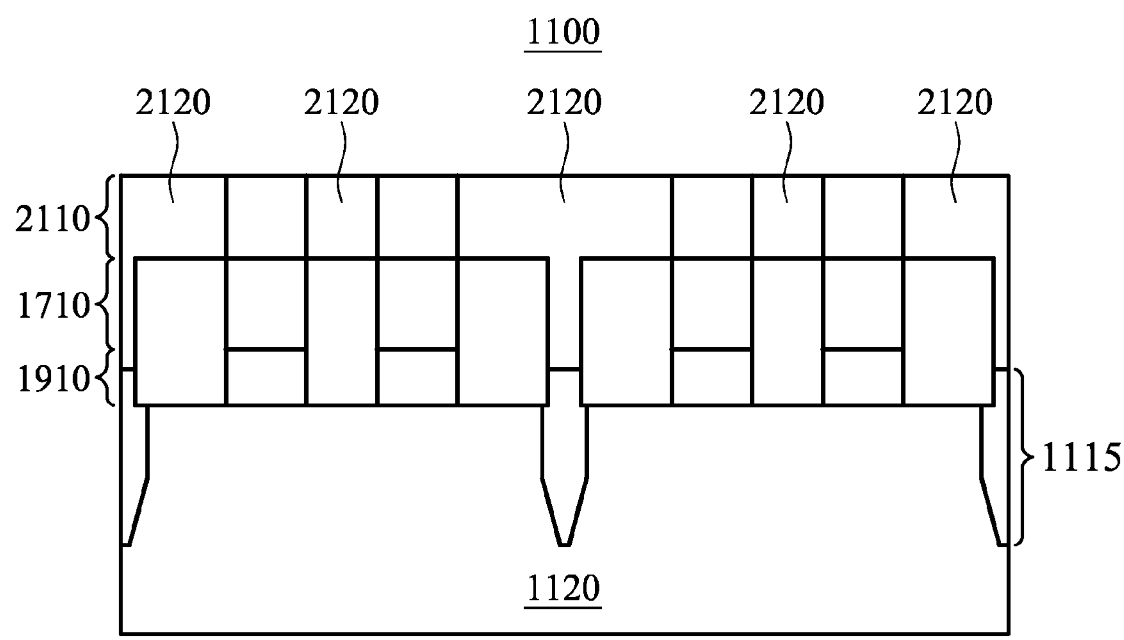

After the process of FIG. 17 and FIG. 18, a channel of the gate structure 1100 may be formed via the Omega gate process as a first example or via the GAA process as a second example. FIG. 19 and FIG. 20 illustrate various cross-sectional views of the gate structure 1100 during performing the Omega gate process on the gate structure 1100. FIG. 21 and FIG. 22 illustrate various cross-sectional views of the gate structure 1100 during performing the GAA process on the gate structure 1100.

In FIG. 19 and FIG. 20, oxidation is performed on the first epitaxial channel layer 1110 to form a third channel layer 1910 that is substantially an oxidation layer. A shallow trench isolation (STI) layer recessing process is also performed on the gate structure 1100 to at least partially removing the STI layer 1115. It can be observed in FIG. 19 and FIG. 20 that the STI layer 1115 is at least partially removed to render the third epitaxial channel layer 1910 to be at least partially exposed. A channel of the gate structure 1100 is thus formed in the second epitaxial channel layer 1710.

Since the dislocations between the first epitaxial channel layer 1110 and the second epitaxial channel layer 1710 have been alleviated, dislocation between the third epitaxial channel layer 1910 and the second epitaxial channel layer 1710 may also be alleviated. Therefore, in the first example, electron and hole leakage of the gate structure 1100 may be substantially alleviated, and operational accuracy of the channel of the gate structure 1100 in the first example may be enhanced.

In FIG. 21 and FIG. 22, the first epitaxial channel layer 1110 is substantially etched. A gate metal layer 2110 is then deposited around the second epitaxial channel layer 1710. An ILD layer 2120 may be additionally formed to at least partially cover the STI layer 1115. A channel of the gate structure 1100 is thus formed in the second epitaxial channel layer 1710.

Since the dislocations between the first epitaxial channel layer 1110 and the second epitaxial channel layer 1710 have been alleviated, dislocations may also be alleviated between the gate metal layer 2110 and the second epitaxial channel layer 1710. Therefore, in the second example, electron and hole leakage of the gate structure 1100 may be substantially alleviated, and operational accuracy of the channel of the gate structure 1100 may be enhanced.

In a third example, during formation of the channel of the gate structure 100, the following conditions may be applied. A pressure of the formation of the channel of the gate structure 100 may be ranged from about 600 milli-Torr (mT) to about 1000 mT. A top coil power utilized for generating plasma of the dry etching process shown in FIG. 15 and FIG. 16 may be ranged from about 50 watts to about 350 watts. A bias voltage of the formation of the channel of the gate structure 100 is ranged from about 0 volts to about 50 volts. A temperature of the formation of the channel of the gate structure 100 may be ranged from about 30 degrees centigrade to about 80 degrees centigrade. A process time of the formation of the channel of the gate structure 100 may be ranged from about 3 seconds to about 50 seconds.

Figure 23:
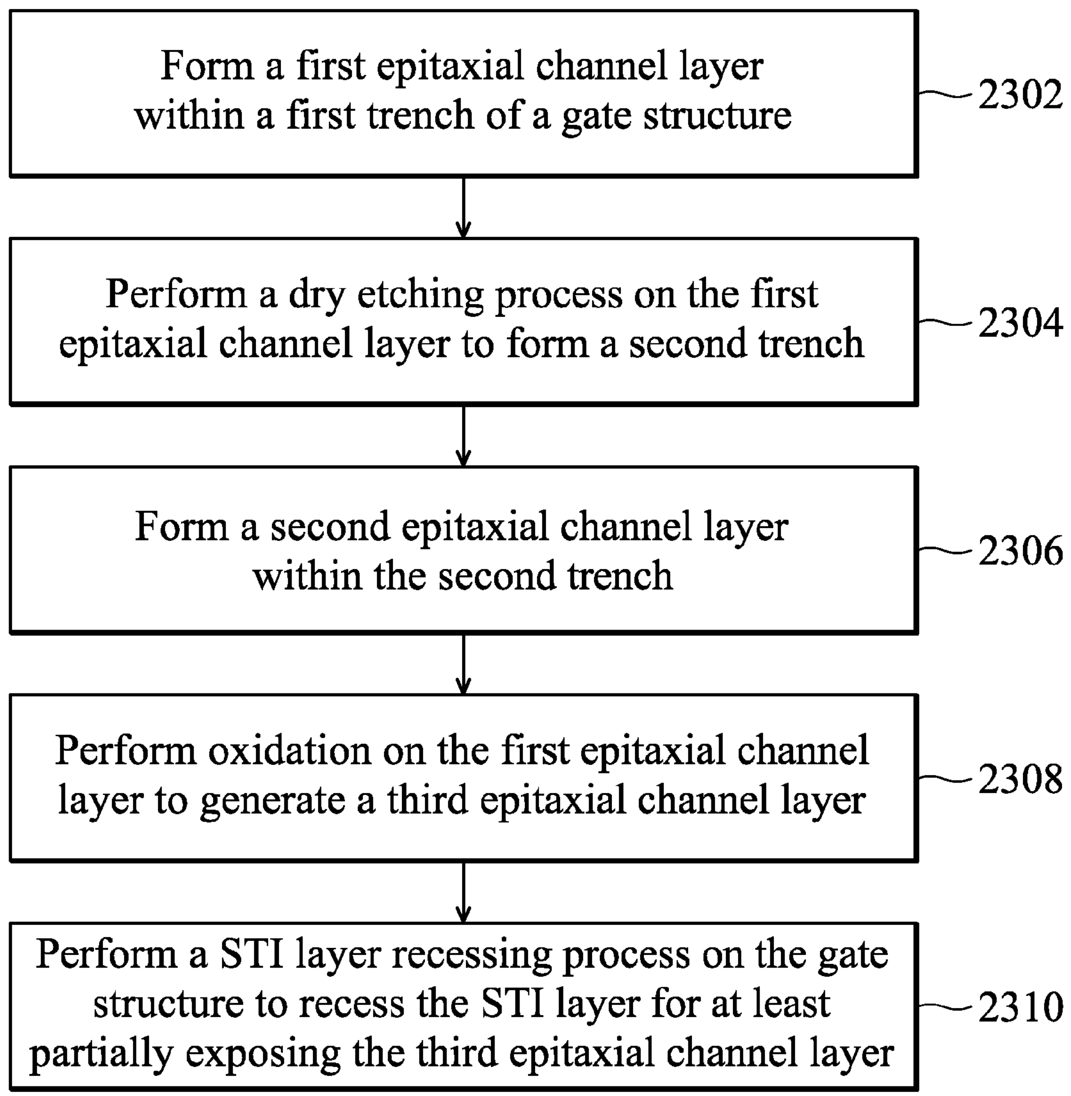
FIG. 23 illustrates a flowchart of a method of forming a channel of the gate structure according to a first example.

FIG. 23 illustrates a flowchart of a method of forming a channel of a gate structure according to the first example. The method includes the following stages: Form a first epitaxial channel layer within a first trench of the gate structure (2302). Perform a dry etching process on the first epitaxial channel layer to form a second trench (2304). Form a second epitaxial channel layer within the second trench (2306). Perform oxidation on the first epitaxial channel layer to generate a third epitaxial channel layer (2308). Perform a STI layer recessing process on the gate structure to recess a STI layer for at least partially exposing the third epitaxial channel layer (2310).

Figure 24:
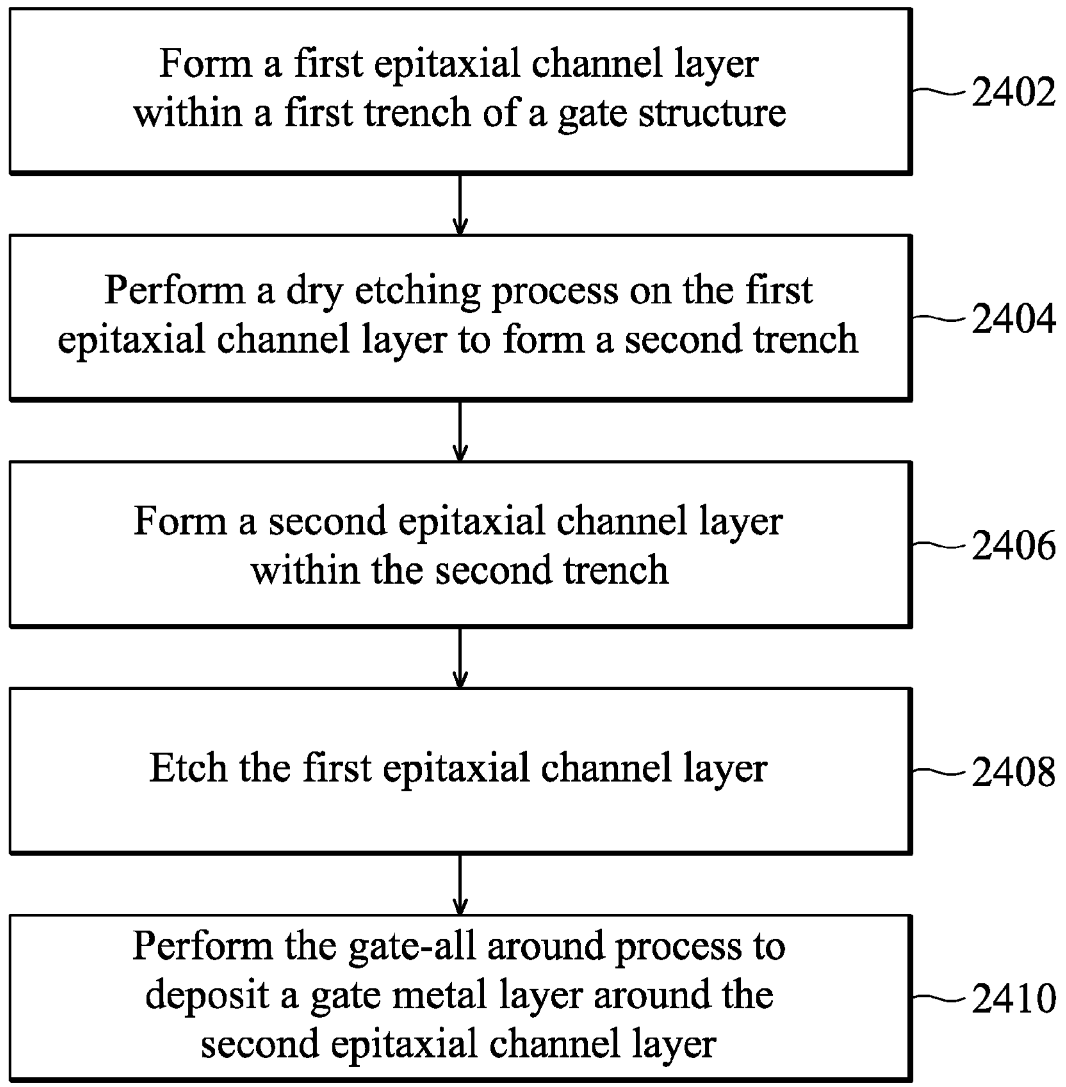
FIG. 24 illustrates a flowchart of a method of forming a channel of the gate structure according to a second example.

FIG. 24 illustrates a flowchart of a method of forming a channel of a gate structure according to the second example. The method includes the following stages: Form a first epitaxial channel layer within a first trench of the gate structure (2402). Perform a dry etching process on the first epitaxial channel layer to form a second trench (2404). Form a second epitaxial channel layer within the second trench (2406). Etch the first epitaxial channel layer (2408). Perform a GAA process to deposit a gate metal layer around the second epitaxial channel layer (2410).

This disclosure teaches a method of forming a channel of a gate structure. With the aid of the taught method, while forming a channel of a gate structure, dislocation between epitaxial channel layers of the gate structure may be substantially alleviated, and electron and hole leakage on the channel may thus be substantially alleviated. Moreover, while forming the channel of the gate structure, a depth of an initial trench for loading the epitaxial channel layers may also be substantially reduced.

This disclosure teaches a method of forming a channel of a gate structure. In one embodiment, a first epitaxial channel layer is formed within a first trench of the gate structure. A dry etching process is performed on the first epitaxial channel layer to form a second trench. A second epitaxial channel layer is formed within the second trench.

This disclosure also teaches a gate structure. The gate structure includes a silicon layer, a shallow trench isolation (STI) layer, a first epitaxial channel layer, and a second epitaxial channel layer. The STI layer is at least partially over the silicon layer. The STI layer has a trench at least partially filled by the silicon layer around a bottom of the trench. The first epitaxial channel layer is formed within the trench. The first epitaxial channel layer is over the silicon layer within the trench. The second epitaxial channel layer is formed within the trench. The second epitaxial channel layer is over the first epitaxial channel layer within the trench.

This disclosure also teaches a method of forming a channel of a gate structure. In this method, a first epitaxial channel layer is formed within a first trench of the gate structure. A chemical mechanical polishing (CMP) process is performed on the first epitaxial channel layer. A dry etching process is performed on the first epitaxial channel layer to form a second trench. A second epitaxial channel layer is formed within the second trench.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. As an example, the structures, layouts, materials, operations, voltage levels, or current levels related to "source" and "drain" described herein (including in the claims) may be interchangeable as a result of transistors with "source" and "drain" being symmetrical devices. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. A method of forming a channel, the method comprising:

forming a silicon layer having a plurality of trenches;

forming shallow trench isolation (STI) material within the plurality of trenches;

forming a first trench by removing at least a portion of the silicon layer that is between adjacent trenches of the plurality of trenches;

forming a first epitaxial channel layer within the first trench;

performing a dry etching process on the first epitaxial channel layer, wherein the performing of the dry etching process forms a second trench; and forming a second epitaxial channel layer within the second trench.

2. The method of claim 1, further comprising:

performing a chemical mechanical polishing (CMP) process on the first epitaxial channel layer after forming the first epitaxial channel layer within the first trench.

3. The method of claim 1, further comprising:

performing oxidation on the first epitaxial channel layer after forming the second epitaxial channel layer to generate a third epitaxial channel layer.

4. The method of claim 3, further comprising:

performing a an STI layer recessing process to recess the STI material, the recessing of the STI material at least partially exposing the third epitaxial channel layer.

5. The method of claim 1, wherein during formation of the first epitaxial channel layer and the second epitaxial channel layer, a pressure of the formation is ranged from about 600 milli-Torr (mT) to about 1000 mT, a top coil power utilized for generating plasma of the dry etching process is ranged from about 50 watts to about 350 watts, a bias voltage of the formation is ranged from about 0 volts to about 50 volts, a temperature of the formation is ranged from about 30 degrees centigrade to about 80 degrees centigrade, and a process time of the formation is ranged from about 3 seconds to about 50 seconds.

6. The method of claim 1, wherein the performing the dry etching process on the first epitaxial channel layer to form the second trench comprises:

using $Cl_2$ gas for etching the first epitaxial channel layer;

using $NF_3$ gas for calibrating a range of performing the dry etching process on the first epitaxial channel layer; and using He gas for diluting densities of the $Cl_2$ gas and the $NF_3$ gas.

7. The method of claim 6, wherein a flux of using the $Cl_2$ gas is ranged from about 20 standard cubic centimeter per minute (sccm) to about 80 sccm, a flux of using the $NF_3$ gas is ranged from about 0 sccm to about 10 sccm, and a flux of using the He gas is ranged from about 300 sccm to about 1000 sccm.

8. The method of claim 1, wherein the forming the first epitaxial channel layer within the first trench comprises forming the first epitaxial channel layer comprising germanium or silicon-germanium within the first trench.

9. The method of claim 1, wherein the forming the second epitaxial channel layer within the second trench comprises forming the second epitaxial channel layer comprising germanium or silicon-germanium within the second trench.

10. The method of claim 1, wherein a density of germanium in the first epitaxial channel layer is higher than a density of germanium in the second epitaxial channel layer.

11. A method of forming a channel, the method comprising:

forming a silicon layer having a plurality of trenches;

forming shallow trench isolation (STI) material within the plurality of trenches;

forming a first trench by removing at least a portion of the silicon layer that is between adjacent trenches of the plurality of trenches;

forming a first epitaxial channel layer within the first trench;

performing a chemical mechanical polishing (CMP) process on the first epitaxial channel layer;

performing a dry etching process on the first epitaxial channel layer, wherein the performing of the dry etching process forms a second trench; and forming a second epitaxial channel layer within the second trench.

12. The method of claim 11, further comprising:

performing oxidation on the first epitaxial channel layer after forming the second epitaxial channel layer to generate a third epitaxial channel layer; and performing an STI layer recessing process to recess the STI material, the recessing of the STI material at least partially exposing the third epitaxial channel layer.

13. The method of claim 11, wherein a density of germanium in the first epitaxial channel layer is higher than a density of germanium in the second epitaxial channel layer.

14. The method of claim 11, wherein the forming the first epitaxial channel layer within the first trench comprises forming the first epitaxial channel layer comprising germanium or silicon-germanium within the first trench; and wherein the forming the second epitaxial channel layer within the second trench comprises forming the second epitaxial channel layer comprising germanium or silicon-germanium within the second trench.

15. A method of forming a channel, the method comprising:

forming a first epitaxial channel layer within a first trench;

performing a dry etching process on the first epitaxial channel layer, wherein the performing of the dry etching process forms a second trench;

forming a second epitaxial channel layer within the second trench; and performing oxidation on the first epitaxial channel layer after forming the second epitaxial channel layer to generate a third epitaxial channel layer.

16. The method of claim 15, further comprising:

performing a chemical mechanical polishing (CMP) process on the first epitaxial channel layer after forming the first epitaxial channel layer within the first trench.

17. The method of claim 15, further comprising:

performing a shallow trench isolation (STI) layer recessing process to recess a STI layer for at least partially exposing the third epitaxial channel layer.

18. The method of claim 15, wherein during formation of the first epitaxial channel layer and the second epitaxial channel layer, a pressure of the formation is ranged from about 600 milli-Torr (mT) to about 1000 mT, a top coil power utilized for generating plasma of the dry etching process is ranged from about 50 watts to about 350 watts, a bias voltage of the formation is ranged from about 0 volts to about 50 volts, a temperature of the formation is ranged from about 30 degrees centigrade to about 80 degrees centigrade, and a process time of the formation is ranged from about 3 seconds to about 50 seconds.

19. The method of claim 15, wherein the performing the dry etching process on the first epitaxial channel layer to form the second trench comprises:

using $Cl_2$ gas for etching the first epitaxial channel layer;

using $NF_3$ gas for calibrating a range of performing the dry etching process on the first epitaxial channel layer; and using He gas for diluting densities of the $Cl_2$ gas and the $NF_3$ gas.

20. The method of claim 19, wherein a flux of using the $Cl_2$ gas is ranged from about 20 standard cubic centimeter per minute (sccm) to about 80 sccm, a flux of using the $NF_3$ gas is ranged from about 0 sccm to about 10 sccm, and a flux of using the He gas is ranged from about 300 sccm to about 1000 sccm.

* * * * *